(12) United States Patent
Gragnic et al.

(10) Patent No.: US 10,127,490 B2
(45) Date of Patent: Nov. 13, 2018

(54) ELECTRONIC DOCUMENT SUCH AS A CHIP CARD WITH REDUCED METALLIZATION

(71) Applicant: OBERTHUR TECHNOLOGIES, Colombes (FR)

(72) Inventors: Elodie Gragnic, Colombes (FR); Olivier Bosquet, Colombes (FR)

(73) Assignee: IDEMIA FRANCE, Colombes (FR)

( * ) Notice: Subject to any disclaimer, the term of this patent is extended or adjusted under 35 U.S.C. 154(b) by 0 days.

(21) Appl. No.: 15/740,745

(22) PCT Filed: Jun. 28, 2016

(86) PCT No.: PCT/FR2016/051606
§ 371 (c)(1),
(2) Date: Feb. 14, 2018

(87) PCT Pub. No.: WO2017/001771
PCT Pub. Date: Jan. 5, 2017

(65) Prior Publication Data
US 2018/0189625 A1    Jul. 5, 2018

(30) Foreign Application Priority Data

Jun. 30, 2015   (FR) ..................... 15 56119

(51) Int. Cl.
*G08B 13/14*       (2006.01)
*G06K 19/077*      (2006.01)
*H01L 23/00*       (2006.01)

(52) U.S. Cl.
CPC ........ *G06K 19/07754* (2013.01); *H01L 24/31* (2013.01); *H01L 2224/48091* (2013.01);
(Continued)

(58) Field of Classification Search
CPC ......... G06K 19/0775; G06K 19/07749; G06K 19/07786; H01L 2924/0002; B65D 2203/10; B65D 5/4233
(Continued)

(56) References Cited

U.S. PATENT DOCUMENTS 6,107,920 A      8/2000  Eberhardt et al.
9,059,098 B2 *   6/2015  Tsurume ............. H01L 27/1266
(Continued)

FOREIGN PATENT DOCUMENTS

EP          2637129 A2      9/2013

OTHER PUBLICATIONS

International Search Report, dated Oct. 7, 2016, from corresponding PCT application No. PCT/FR2016/051606.

*Primary Examiner* — Eric M Blount
(74) *Attorney, Agent, or Firm* — Young & Thompson

(57) ABSTRACT

The fabrication of an electronic document includes the following steps: —obtaining of a flat body in which is made a cavity of globally rectangular shape including a deep portion surrounded by a countersink and which contains an electronic component having connection terminals situated on this countersink while having the shape of meanders 5A, 5B, —obtaining of a module including a support furnished on a so-called external face with a plurality of external contact zones and on a so-called internal face with a printed circuit including connection pads 4A, 4B of hefty form while being connected to certain at least of the external contact zones, the support being furthermore furnished, on this internal face, with a microcircuit connected to this printed circuit, this module being encased in the cavity by an anisotropic conducting adhesive whose overlap coefficient lies between 5 and 8%.

20 Claims, 3 Drawing Sheets

Figure 1:
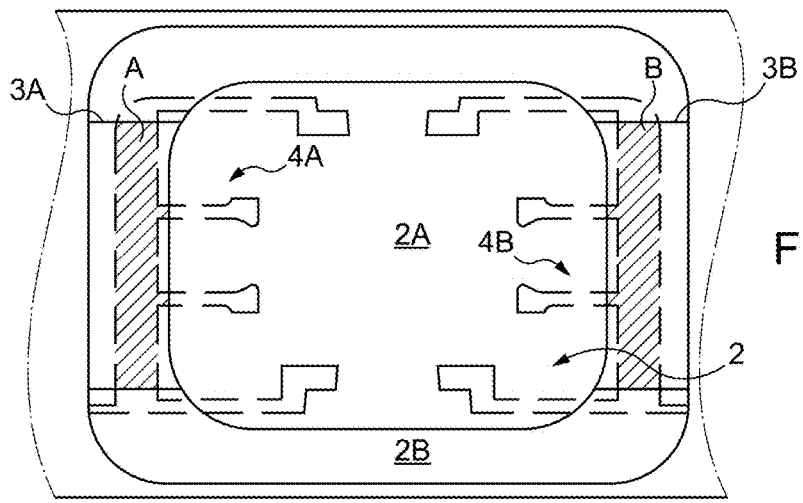

(52) U.S. Cl.
CPC .............. *H01L 2224/48227* (2013.01); *H01L 2924/181* (2013.01)

(58) Field of Classification Search
USPC ...................................... 340/572.7
See application file for complete search history.

(56) References Cited

U.S. PATENT DOCUMENTS

| | | | |
|---|---|---|---|
| 9,882,271 B2 * | 1/2018 | Lam .................. | H01Q 1/50 |
| 2006/0255157 A1 * | 11/2006 | Launay ............ | G06K 19/07745 |
| | | | 235/492 |
| 2007/0052088 A1 * | 3/2007 | Tsurume .............. | H01L 23/367 |
| | | | 257/707 |
| 2010/0181385 A1 * | 7/2010 | Brod ................ | G06K 19/07749 |
| | | | 235/492 |
| 2015/0161501 A1 | 6/2015 | Krull et al. | |
| 2015/0249070 A1 * | 9/2015 | Illek ................... | H01L 25/0753 |
| | | | 257/89 |
| 2017/0155189 A1 * | 6/2017 | Gragnic .................. | H01Q 7/00 |

* cited by examiner

ELECTRONIC DOCUMENT SUCH AS A CHIP CARD WITH REDUCED METALLIZATION

The invention relates to the creation of an electronic document having a body in which a cavity opening onto one of the faces of the body contains a module that has to be connected to a component contained in this body at a distance from this cavity. This component may in particular be an antenna, and the document may be, in particular, a banking chip card or identity document chip card, such as for example an identity card or passport. According to the invention, its metallization is reduced in comparison with existing solutions.

In practice, the body is formed at the same time as the component, by forming a cavity before the step of fastening the module in the cavity, called "inlaying step".

In a known manner, the body may be formed by laminating an inlay, on which the component, in particular an antenna, is formed, between two layers of plastic; in practice, the cavity has a deep central portion surrounded by a peripheral zone formed of a counterbore, with a depth considerably smaller than that of the central portion and that is chosen such that the module is flush with the surface of the card body once it has been fastened in the cavity. The component is formed within the body, such that it has connection terminals that are situated on the peripheral zone, level with the counterbore. This cavity may exist beforehand, or be machined after lamination.

However, for economic reasons in particular, it has also been proposed to form the body in one piece, for example by molding around the component, and to machine the cavity until said connection terminals are exposed.

In a manner that is also known, the module has a flat carrier of small thickness having, on a face termed external face, a plurality of external contact zones that are intended to interact through contact with contact zones of an external reader, and on a face termed internal face, a printed circuit formed of connection tracks and a microcircuit (also called "integrated circuit" or "chip") connected to the external contact pads by way of the printed circuit; the connection between the terminals of the microcircuit and the printed circuit may be direct (if the terminals of the microcircuit are on the face of the microcircuit facing the carrier) or be obtained using connecting wires (if the terminals of the microcircuit are opposite the carrier, thereby offering greater flexibility given the variety of geometries of the microcircuits that are able to be introduced). The printed circuit is connected to the external contact pads by way of wells, that is to say holes in the carrier through which connecting wires are passed, or metallized vias, that is to say by way of holes passing through the entire thickness of the carrier and the walls of which are metallized in order to establish an electrical link between the metallized zones situated on either side of the carrier at the location of the via in question. In practice, the printed circuit has metallized zones that are situated close to the periphery thereof and that are connected to the microcircuit; upon inlaying, the microcircuit is housed in the deep portion of the cavity, whereas only portions of the printed circuit extend as far as the peripheral zone of the internal face of the carrier, which face is intended to face the counterbore of the cavity; said metallized zones of the printed circuit and the terminals of the component are arranged such that, upon inlaying, they face one another in order to provide an good electrical link between the component and the microcircuit. The electrical connection between these zones and these terminals is formed in practice by way of an electrically conductive adhesive material that is preferably anisotropic (that is to say conductive in a single direction, namely a direction perpendicular to these zones and to these terminals).

It is understood that, in order to guarantee a high level of reliability of the electrical connection between the component and the microcircuit without having to set zone positioning tolerances and inlaying tolerance limits that are overly drastic, it is generally considered necessary to form the terminals of the component and the metallized zones that are situated at the periphery of the module in the form of solid metallized blocks.

In order to provide the link between the module and the body, it has been proposed to provide the mechanical link using an adhesive and the electrical link using specific lugs (a technique sometimes called "bumps technology"). However, with the constant tendency toward miniaturization, it is now common to use an anisotropic conductive adhesive, which provides both types of link.

It is important to note, however, that the material used to form the metallized zones to be electrically linked is typically copper, that is to say a metal the cost of which is non-negligible, such that there would be a significant financial benefit to being able to reduce the amount of copper deposited without reducing the reliability of the electrical connection.

The aim of the invention is to meet this objective, and more generally to minimize the drawbacks of the known solutions.

To this end, it proposes a method for manufacturing an electronic document, having the following steps:
  obtaining a flat body with a constant thickness, at least 5 times smaller than its length and than its width, in which body is formed a cavity of rectangular overall shape having a deep portion surrounded by a counterbore and that contains an electronic component having connection terminals that are situated on this counterbore,
  obtaining a module having a flat carrier with a thickness at most equal to the depth of the counterbore and equipped, on a face termed external face, with a plurality of external contact zones and, on a face termed internal face, with a printed circuit forming connection tracks and having connection pads, in solid form, at two peripheral locations of the carrier, this printed circuit being connected to at least some of the external contact zones, the carrier furthermore being equipped, on this internal face, with a microcircuit connected to this printed circuit,
  inlaying the module into the cavity, such that the connection pads of the module face the connection terminals of the component and together define an area of coverage/overlap, with interposition, between the module and the counterbore of the cavity, of an electrically conductive anisotropic adhesive formed of a plurality of conductive particles in an adhesive matrix and providing both a mechanical link between the module and the body and an electrical connection between the connection terminals of the component and the connection pads of the module,
  characterized in that the connection terminals of the component are formed by meanders extending parallel to the edges of the counterbore at a distance from the corners of this counterbore, and the anisotropically electrically conductive adhesive is chosen so as to have a coefficient of overlap by the particles, of the area of overlap, of between 5 and 8%.

By virtue of this configuration in meander form, it is possible to obtain a good electrical connection in combination with a good mechanical link without the risk of a short circuit, even in the case of small modules, while controlling the amount of metallization material.

According to advantageous features of the invention, which may be combined:
- the cavity is obtained by machining after the body containing the component has been formed, this machining exposing the meanders at the surface of the counterbore; this has the particular advantage of combining an inexpensive technique for manufacturing the body and an efficient method for exposing the meanders,
- the meanders are formed by a wire with a diameter of between 120 and 160 microns; this enables a tangible reduction in the amount of metallization material necessary for forming the connection terminals, while making use of techniques that are already well mastered,
- the meanders are formed by a wire with a circular cross section that is embedded in the body, the cavity being formed by machining this body, a checking step being provided to measure the area of this wire exposed by the machining, the inlaying step taking place only under the proviso that this area represents at least ⅔ of the maximum area that is able to be exposed by this machining; this makes it possible to combine a high level of reliability in the exposed area intended for the connection of the module with inexpensive techniques,
- the anisotropic conductive adhesive is formed of an electrically insulating matrix containing conductive particles with a diameter of between 20 and 60 microns, preferably between 30 and 50 microns, this adhesive being applied with an initial thickness of between 35 and 100 microns; the ratio between the initial thickness of the layer of adhesive and the diameter of the particles is preferably at least approximately between 150 and 200%.

According to another aspect, the invention proposes an electronic document having
- a flat body with a constant thickness, at least 5 times smaller than its length and than its width, in which body is formed a cavity of rectangular overall shape having a deep portion surrounded by a counterbore and that contains an electronic component having connection terminals that are situated on this counterbore,
- a module having a flat carrier with a thickness at most equal to the depth of the counterbore and equipped, on a face termed external face, with a plurality of external contact zones and, on a face termed internal face, with a printed circuit forming connection tracks and having connection pads, in solid form, at two peripheral locations of the carrier, this printed circuit being connected to at least some of the external contact zones, the carrier furthermore being equipped, on this internal face, with a microcircuit connected to this printed circuit, this module being inlaid into the cavity, such that the connection pads of the module face the connection terminals of the component and together define an area of coverage/overlap, with interposition, between the module and the counterbore of the cavity, of an anisotropically electrically conductive adhesive formed of a plurality of conductive particles in an adhesive matrix and providing both a mechanical link between the module and the body and an electrical connection between the connection terminals of the component and the connection pads of the module, characterized in that the connection terminals of the component are formed by meanders extending parallel to the edges of the counterbore at a distance from the corners of this counterbore, and the anisotropically electrically conductive adhesive has a coefficient of overlap by the particles, of the area of overlap of between 5 and 8%.

According to other advantageous features of the invention, which may be combined:
- The anisotropic conductive adhesive is formed of an electrically insulating matrix containing particles with a diameter of between 20 and 60 microns, this adhesive having a thickness smaller than this diameter; this means that the particles are at least partly embedded in the metal zones that are to be electrically connected,
- the meanders extend over a distance at least approximately equal to the dimension of the deep central portion of the cavity that is parallel to these meanders; this makes it possible to obtain a significant area without the risk of reducing the mechanical strength of the link of the module in the cavity,
- the meanders extend over a distance of at most 1.60 mm in a direction perpendicular to these meanders, and have a spacing of between one and three times, preferably between two and three times, the width of these meanders; this value of 1.60 mm is of the order of the width of the counterbores that are provided for small modules; specifically, the invention is of particular benefit in the case of small modules, for example the one known under the specification M3,
- the area of overlap represents between 20 and 30% of the area of the connection pads that faces the counterbore of the cavity,
- the document forms a card of rectangular shape, thereby making it possible to exploit manufacturing techniques that are perfectly mastered with respect in particular to cards in formats defined by the standards ISO 7816 and 14443, in particular the format known under the specification 1FF for credit cards or bank cards,
- the component is an antenna; this enables the document to be of dual type, capable of communicating through contact (by way of external contact pads) and contactlessly (by virtue of the antenna),
- the module has maximum dimensions of: 8.5 mm*11 mm; this means that the module is in a small format in comparison to what is currently known, for example to the M3 format.

Figure 2:
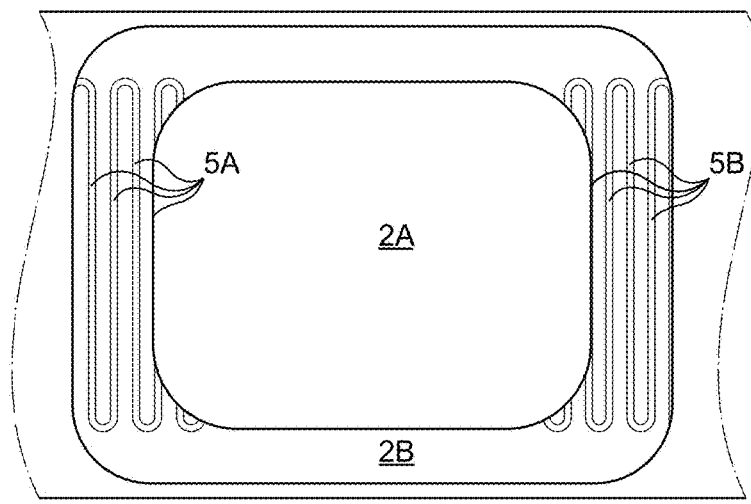
Figure 3:
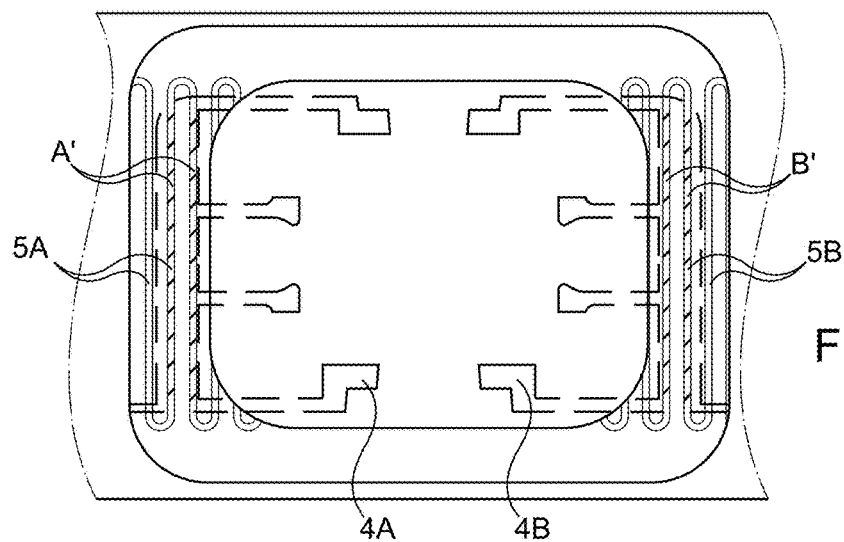
Figure 4:
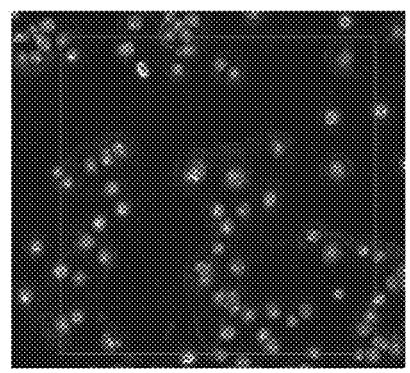
Figure 5:
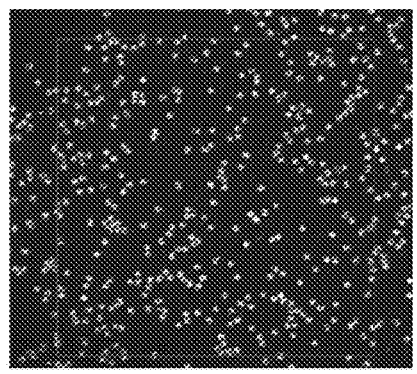
Figure 6:
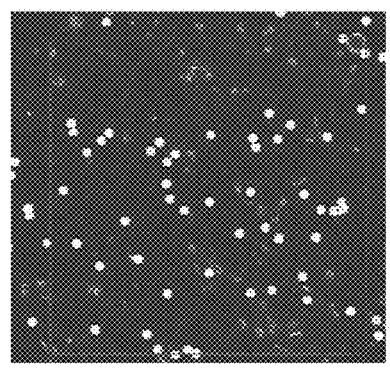
Figure 7:
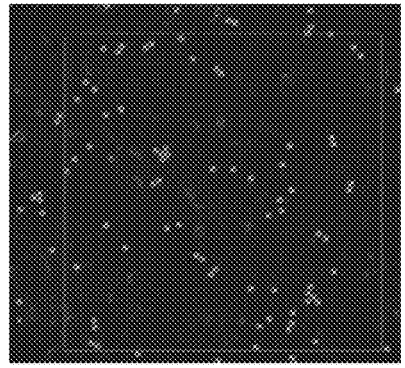
Figure 8:
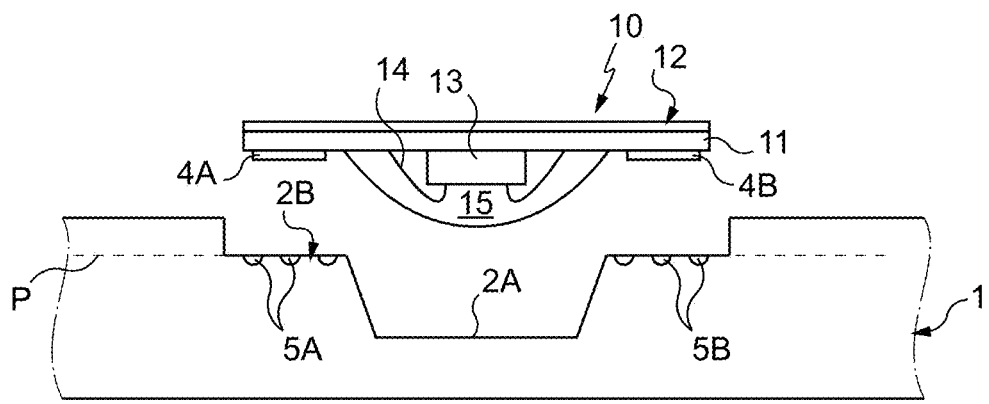
Figure 9:
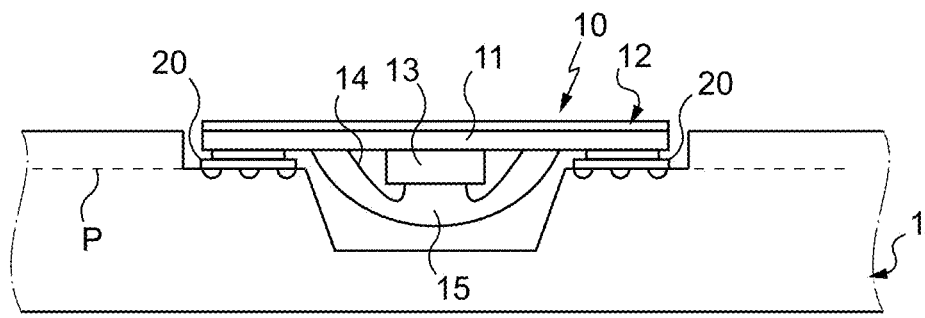

Aims, features and advantages of the invention emerge from the following description, given by way of illustrative and non-limiting example with reference to the appended drawings, in which:

FIG. 1 is a plan view of the cavity of an electronic document body (not according to the invention) depicting the printed circuit of a module mounted in this cavity and more particularly the zone of overlap between connection zones of a component contained in the body and the connection pads of the module, FIG. 2 is a plan view of the cavity of an electronic document body according to the invention, FIG. 3 is a view similar to that of FIG. 1, but with the cavity of FIG. 2, FIG. 4 is a photograph of the distribution of the conductive particles within a first anisotropically electrically conductive adhesive, according to the invention, FIG. 5 is a photograph of the distribution of the conductive particles within a second anisotropically electrically conductive adhesive, not according to the invention, FIG. 6 is a photograph of the distribution of the conductive particles within a third anisotropically electrically conductive adhesive, not according to the invention, FIG. 7 is a photograph of the distribution of the conductive particles within a fourth anisotropically electrically conductive adhesive, not according to the invention, FIG. 8 is a cross-sectional diagram showing a module on the point of being inlaid into a body so as to form an electronic document according to the invention, and FIG. 9 is a diagram of the result of the inlaying of FIG. 8.

FIG. 1 shows part of an electronic document body, referred to under the reference 1, in which a cavity 2 has been formed, so as to have a central portion 2A with a large depth and a peripheral portion 2B with a smaller depth, formed in practice by a counterbore. This cavity usually has a rectangular overall shape, with small sides, in this case vertical, and large sides, in this case horizontal; such a rectangular shape is observed for the deep central portion and likewise for the counterbore; the corners of this central portion and those of the counterbore are rounded. By convention, dimensions measured parallel to the small sides are called "heights". If the document under consideration is a chip card, the small sides of the module are parallel to the small sides of the card body, whereas the large sides of the module are parallel to larger sides of the card body.

Connection zones, linked to a component (not shown) integrated into said body, are formed on this counterbore; in the example under consideration here, this component is an antenna. These connection zones 3A and 3B are solid and occupy the entire width of the counterbore, over slightly less than the entire height of the cavity (of the order of 8/10ths).

This FIG. 1 also shows a possible shape for connection pads 4A and 4B that are provided on a module intended to be mounted in the cavity; more precisely, these connection pads are in the shape of combs, with a solid part extending along the height of the cavity (over around 80% to 90% of the height of the deep part), and tracks extending from this solid part toward the other pad in the shape of a comb, parallel to the large sides of the cavity. The hatched zones A and B depict the area of overlap between the terminals of the component and the pads of the module; it is able to be appreciated that this area is solid. In fact, as a variant, these connection pads may no longer be configured as a comb as is shown in this FIG. 1, but may more simply be configured in a solid manner while having a larger dimension in a horizontal direction of FIG. 1 (this explains why reference may be made to width in order to specify dimensions parallel to this direction).

A module intended to be mounted in the cavity has a shape that is very close to that of the cavity at the counterbore, being slightly smaller in order to provide a degree of play when mounting.

The module may have two series of external contact zones bordering the small sides of the module; in one configuration developed in the context of miniaturizing modules and chip cards, the module may, as a variant, have two series of three contact pads and have maximum dimensions of 8.5 mm in a first direction Y and 11 mm in a second direction X, with (or without) two other contact pads. This corresponds to a format usually specified under the abbreviation M3 that is particularly targeted by the invention.

To minimize the amount of copper used to form the connection terminals of the component, it is proposed, according to one aspect of the invention, for these terminals to be formed by electrically conductive meanders 5A and 5B, it is seen in FIG. 2 that these meanders extend parallel to the edges of the counterbore, along the height defined above. It is readily understood that, in the particular case in which the component is an antenna, these meanders may simply be an extension of the tracks of the antenna; these tracks may be formed of a wire embedded into the body or of wires deposited by any suitable means. This concept of meanders may also be defined by saying that these connection terminals are formed by ends, in zigzag or coil form, of the tracks for connection to the component (or ends thereof).

The reduction in the amount of copper may therefore be quite significant; this depends on the width of the meanders and their spacing; in the example shown, the reduction may exceed 65%.

If FIG. 3 is compared with FIG. 1, it is seen that the area of overlap between the meanders 5A or 5B and the connection pads of the module (see zones A' and B') is much smaller, especially as, in the example shown, only some of the meanders contribute to this overlap (out of the four meanders that it is possible to identify in FIG. 2, only two face the pads of the module). The reduction is by about a factor of 3. It should be noted, in this respect, that the area of overlap, in this configuration in meander form, may vary within usually accepted tolerances with regard to the positioning of the connection terminals (now formed by these meanders) on the counterbores and the positioning of the module upon inlaying. In the case of a module having the standard dimensions specified under the reference M3, it thus appears that, upon inlaying, an upward or downward offset of 1 to 1.5 mm or an offset to the right or to the left of 0.1 to 0.2 mm (with reference to FIG. 3) may cause the area of overlap to vary by more than 10%.

The connection terminals formed by such meanders (in practice between two and five meanders) have a width at most equal to the width of the counterbore, this corresponding to a maximum of 1.60 mm for a module of M3 type.

It may be noted that the aforementioned ratio 3 corresponds to the fact that the spacing between two meanders is of the order of double the width of the tracks; according to the invention, this ratio advantageously has a value of between 1 and 3 (that is to say that the spacing between two meanders has a value of between one time and three times, preferably between two times and three times, the width of the conductive tracks forming the meanders). Specifically, for conductive wires with a minimum diameter of 110 µm, the machining results in a cross section of a width of around 100 µm. The minimum deposition interval is 300 µm, i.e. a spacing of 300–100=200 µm. A ratio of 2 results therefrom. This value increases with the diameter of the wire insofar as the interval is also increased when the wire is embedded into the plastic body.

It is readily understood that the choice of such a configuration of the connection terminals, in the form of meanders or zigzags, owing to the drastic reduction of the area of overlap, would be rejected a priori by those skilled in the art, who are looking to guarantee, in spite of high production rates and possible miniaturization of the cavities and of the modules, a high degree of reliability of the electrical connections between the module and the microcircuit.

However, it has emerged that, under the proviso of using an appropriately chosen anisotropic conductive adhesive (reference is sometimes made to ACF for short, for "anisotropic conducting adhesive"), good electrical conduction could be guaranteed in spite of this drastic reduction of the area of overlap.

It is said that the adhesive is anisotropic in the sense that it provides electrical conductivity in only one direction, namely a direction perpendicular to the areas to be mechanically linked; in fact, it is more accurate to say that this adhesive is anisotropically electrically conductive.

This anisotropic nature is obtained by way of conductive particles distributed within an electrically insulating adhesive matrix; the particles are at least approximately spherical, with diameters that are at least approximately equal.

The particles, or beads, are at least electrically conductive at the surface, and are for example coated with a layer of silver; their mass may itself be metallic (for example made of copper) or non-metallic, for example made of a polymer. With regard to the matrix, this is usually formed of a hot-melt material, for example a polyester or a polyamide.

Among the features of such anisotropic conductive adhesives, mention may be made in particular of the coefficient of overlap, defined as being, following assembly, with reference to the interface between the surfaces to be linked, the ratio between the area occupied by the conductive particles and the area occupied by the adhesive; to this end, it is noted that, upon inlaying, the particles are embedded into the conductive zones (most often made of copper, as indicated above). The recommended level of embedding is 70% of the diameter of the particles in order to guarantee a good connection. In fact, given the very small dimensions of the particles, the assumption used here is that the particles have a contact area equal to the diametric cross section corresponding to that of the particles. Thus, the contribution of a particle to the contact area is equal to its maximum cross section. In addition, for a particle with a diameter of 30 µm, the recommended remaining thickness of adhesive is 20 µm, as the adhesive creeps over the edges and reduces in thickness until reaching a thickness of less than or equal to the thickness of the particles.

It is understood that the anisotropic nature of the adhesive implies that the particles are normally effectively remote from one another and that the level of overlap is not excessively high so as to ensure a good mechanical hold; by contrast, if the level of overlap is too small, the adhesive provides an electrical connection over only a small fraction of the area of overlap of the metallized zones to be connected.

It is understood that, to characterize an anisotropic conductive adhesive, it is possible to use an imaging device that is known per se to highlight, by contrast, conductive particles in a layer of such an adhesive, count these particles over a given area of this layer, and deduce therefrom a coefficient of overlap, as defined above.

The photos of FIGS. 4 to 7 correspond to four anisotropic conductive adhesives that are defined as follows:

FIG. 4 corresponds to a first adhesive with an initial thickness of 70 microns and particles with a diameter of 40 microns, at a rate of 57 particles per $mm^2$; this corresponds to a level of overlap of $1/14$, i.e. 7.1%; an almost regular distribution of sizeable particles is observed, FIG. 5 corresponds to a second adhesive with a thickness of 35 microns and particles with a diameter of 20 microns, at a rate of 300 particles per $mm^2$; this corresponds to a level of overlap of $1/10$, i.e. 10%; an almost homogeneous distribution of small particles is observed, FIG. 6 corresponds to a third adhesive with a thickness of 50 microns and particles with a diameter of 30 microns, at a rate of 50 particles per $mm^2$; this corresponds to a level of overlap of $1/30$, i.e. 3.3%; an inhomogeneous distribution is observed (the differences in appearance result from a difference in depth of the particles in the adhesive), leaving zones that are free of any particles, FIG. 7 corresponds to a fourth adhesive with a thickness of 35 microns and particles with a diameter of 20 microns, at a rate of 100 particles per $mm^2$; this corresponds to a level of overlap of $1/30$, i.e. 3.3%; an inhomogeneous distribution of small particles is observed, resulting in zones that are free of any particles.

Tests of inlaying into the configuration of FIG. 3 were carried out, and gave the following results:
1st sample: tests satisfactory
2nd sample: module detachment
3rd sample: loss of electrical connection in what is termed a card deformation test in the direction of the height (small side)
4th sample: loss of electrical connection for the test outlined above.

Thus, only the first adhesive emerged as satisfactory;
the inadequate behavior of the second seems to be attributable, with everything else otherwise remaining the same, to the excessive number of particles, which weaken the adhesion;
the inadequate behavior of the third seems to be attributable to the inhomogeneity and the poor distribution of the particles, and
the inadequate behavior of the fourth also seems to be attributable to the inhomogeneity and the poor distribution of the particles.

It should be noted that the choice of the thickness of adhesive (linked to the choice of the particle size) also has an impact on the position of the module in the card body; the greater the thickness, the more the external contact zones risk protruding with respect to the surface of the body; by contrast, a reduction in the thickness may lead to a situation whereby the module is recessed with respect to this surface.

It may be noted from the above that it is necessary to choose an adhesive the particles of which are distributed regularly and correspond to a level of overlap of greater than 5% but less than 10%, preferably not greater than 8%. The size of the particles is preferably between 20 and 60 microns, for example between 30 and 60 microns, or even 30 and 50 microns. It furthermore seems to be preferable to use adhesives corresponding to thicknesses that are sufficient to provide regular adhesion over the entire counterbore, in spite of the surface irregularities caused by the presence of the metallized zones; this tends to suggest adhesives that are intended to be applied with initial thicknesses of at least 35 microns, for example of between 35 and 100 microns. After the inlaying step, which is a hot-pressing step, the thickness of the adhesive decreases through a creep phenomenon, and then has a thickness of less than or equal to that of the particles. The aforementioned level of overlap, combined with the aforementioned dimensions, corresponds to a density of particles that is preferably between 50 and 100 per $mm^2$, or even 80 per $mm^2$.

Use is generally preferably made of adhesives the particles of which have a chosen diameter of between 20 and 60 microns, preferably of between 30 and 50 microns, and the adhesive is applied with an initial thickness of between 35 and 100 microns; in practice, the layer of adhesive is applied with an initial thickness preferably of between the order of 150% and 200% of the diameter of the particles; after introduction, the layer of adhesive may have a thickness with a value of just a fraction of the diameter of the particles, for example of the order of $2/3$, or even of the order of $1/2$.

All of these features make it possible to define an optimal balance for guaranteeing a good electrical connection, in spite of the small area of copper at the ends of the component, and a good mechanical link on a small module.

Given here are a few connection area values dependent on the type of adhesive and on one or the other of two geometries for the connection terminals (either a solid form or a zigzag configuration):

- 1st adhesive: the area with a zigzag configuration measures 0.095 mm$^2$, rather than 0.295 mm$^2$ with solid terminals,
- 2nd adhesive: the area with a zigzag configuration measures 0.132 mm$^2$, rather than 0.412 mm$^2$,
- 3rd adhesive: the area with a zigzag configuration measures 0.044 mm$^2$, rather than 0.137 mm$^2$, and
- 4th adhesive: the area with a zigzag configuration measures 0.44 mm$^2$.

To increase the level of overlap between the connection pads of the module and the terminals, in zigzag form, of the component, it is advantageous to increase the height of said terminals, that is to say to form these zigzags over roughly the entire height of the deep portion of the cavity, for example to within 5% (see FIG. 2). By contrast, tests have shown that, if the meanders extend beyond this, that is to say as far as the corners of the counterbore, the mechanical link worsens.

Given the standard dimensions of the modules that are usually used and of the cavities that are intended to receive them, the conclusion is to stipulate a height of 6.5 mm as being a good compromise between a good electrical connection and a good mechanical link.

The invention applies particularly well when the area of overlap advantageously represents 20% to 30% of the area of a connection pad facing the counterbore bordering the cavity (it may be useful to take the mean of the values corresponding to the two connection terminals).

FIG. 8 shows the module of FIG. 1 or 3 on the point of being inlaid within the cavity of the body 1.

As indicated with respect to FIGS. 1 and 3, this module, denoted 10, advantageously has, for reasons of saving copper combined with reasons of miniaturization, connection pads that are situated on the small sides and configured in the shape of a comb. These connection pads form part of a printed circuit (not shown here) formed on an internal face of a carrier 11 bearing, on its external face (turned upward), a plurality of external contact zones, the set of which is denoted 12; there is also fastened, on the internal face, a microcircuit 13 forming the "chip" linked to the printed circuit by wired links 14, conventionally formed by gold wires. The microcircuit 13 and the wires are conventionally integrated into a resin mass 15.

The counterbore 2B of the cavity is bordered by meanders 5A and 5B that are linked to a component integrated into the body 1. This component is advantageously an antenna formed of turns that are formed in a plane situated at a given depth in the body, represented by a dotted line denoted P.

This body may be formed of an inlay on one face of which this antenna has been formed, and laminated with at least one cover layer in order to integrate the antenna within the body; in such a case, the cavity may be formed in this cover layer after the lamination operation.

However, the body may furthermore be formed in a single piece, by overmolding over the component, in this case the turns of the antenna, with a material forming the body (in addition to any carrier of the component). In such a case, the cavity may be formed after such overmolding, by machining carried out until the meanders 5A and 5B are exposed.

When the meanders are formed of a wire with a cross section that is usually circular, it is understood that, depending on the actual depth of the machining, the exposed cross section of this wire is more or less large, with a maximum when the machining has exposed the wire in a plane passing through the axis of the wire, that is to say exposing a cross section with a width equal to the diameter of the wire.

Advantageously, before proceeding, in an industrial production phase, with the inlaying of a module within a cavity thus formed by machining as far as, with regard to the connection terminals, the depth of the conductive wires, it is checked that the area of copper thus exposed is large enough to establish a good electrical connection with the chosen anisotropic conductive adhesive.

In fact, even before choosing such an adhesive, it is possible to provide such a step of measuring the exposed area of copper, so as to evaluate a range of values that are able to be obtained for this area, and to deduce therefrom the features that an anisotropic conductive adhesive has to have in order to be able to effectively provide a good electrical connection and a good mechanical link. This prior step makes it possible, once the adhesive has been chosen, to determine the minimum area that the machining, in series production, has to have exposed in order to guarantee that the adhesive will provide a good electrical connection between the component and the microcircuit.

It is understood that the area that is able to be obtained depends on the precision of the machining (so as to stop precisely at the level where the cross section of the wire is at a maximum), but also on the diameter of this wire and on the spacing between the meanders of this wire; thus, during this development phase, it may be decided to adjust the geometry of the meanders of the connection terminals of the component. In practice, since one and the same wire is advantageously used to form antenna turns and connection terminals of such an antenna, the wire diameters are, in the case of a component formed of an antenna, advantageously chosen to be between 120 and 160 microns.

In fact, this prior step may also be performed through calculation, by determining the maximum area that is able to be exposed, given the configuration chosen for the meanders forming the connection terminals. The minimum area to be exposed may then be evaluated, for example a value of between 50% and 75% of the maximum area that is able to be obtained, for example of the order of ⅔, or of 70%.

By way of example, if it is found that the maximum area that is able to be exposed by machining has a value of 1.32 mm$^2$, the minimum value may be chosen to be between 0.8 mm$^2$ and 1 mm$^2$ depending on the agreed safety margin. Such values may in particular be chosen in combination with modules the connection pads of which have areas of between 4.50 and 5.00 mm$^2$, in particular 4.75 mm$^2$.

If the checking step reveals an exposed area smaller than the chosen threshold, the card body may be discarded without carrying out any inlaying whatsoever thereon; as a variant, the discarding may take place in a later step, after inlaying, if this is more efficient and more economical.

By way of example, this checking step is carried out by way of a high-speed camera, for example of "Sherlock" type, positioned at the exit of a machining station to capture an image of each cavity; computer software linked to the camera transforms the image thus captured into a connection area value (typically by discriminating between the light zones, attributed to the conductive zones, and the darker zones, attributed to the zones occupied by the plastic forming the body of the document (or card body). If the area thus detected for each of the connection terminals of a given cavity is not at least equal to the chosen threshold, the body will subsequently be discarded.

A document body may thus be discarded for several reasons, due to machining to an insufficient depth, inadequate brushing of the area of conductive material, a detachment of the conductive wire, etc.

It is readily understood that an electronic document obtained by the method is able to be identified from features relating to the connection terminals and the adhesive that is used.

It is thus recognized, in particular, by the presence of a layer of adhesive 20, having the properties mentioned above, between its pads and its connection terminals.

In practice, the adhesive may be applied equally on the counterbore or on the periphery of the module.

An electronic document according to the invention is flat in that its thickness is constant and has a value of at least 5 or even 10 times less than its other dimensions. In the case of a banking chip card, the ratio even has a value of the order of a hundredth of its largest dimension, and less than a fiftieth of its width.

As has already been mentioned, the module is advantageously in a small format, the same as or smaller than the one defined by the dimensions 8.5 mm*11 mm.

The invention claimed is:

1. A method for manufacturing an electronic document, having the following steps:
    obtaining a flat body with a constant thickness, at least 5 times smaller than its length and than its width, in which body is formed a cavity (2) of rectangular overall shape having a deep portion (2A) surrounded by a counterbore (2B) and that contains an electronic component having connection terminals that are situated on this counterbore,
    obtaining a module having a flat carrier with a thickness at most equal to the depth of the counterbore and equipped, on a face termed external face, with a plurality of external contact zones and, on a face termed internal face, with a printed circuit forming connection tracks and having connection pads (4A, 4B), in solid form, at two peripheral locations of the carrier, this printed circuit being connected to at least some of the external contact zones, the carrier furthermore being equipped, on this internal face, with a microcircuit connected to this printed circuit,
    inlaying the module into the cavity, such that the connection pads (4A, 4B) of the module face the connection terminals (5A, 5B) of the component and together define an area of coverage/overlap, with interposition, between the module and the counterbore of the cavity, of an electrically conductive anisotropic adhesive formed of a plurality of conductive particles in an adhesive matrix and providing both a mechanical link between the module and the body and an electrical connection between the connection terminals of the component and the connection pads of the module,
    wherein the connection terminals of the component are formed by meanders (5A, 5B, 20) extending parallel to the edges of the counterbore at a distance from the corners of this counterbore, and the anisotropically electrically conductive adhesive is chosen so as to have a coefficient of overlap, by the particles, of the area of overlap, of between 5 and 8%.

2. The method as claimed in claim 1, wherein the cavity is obtained by machining after the body containing the component has been formed, this machining exposing the meanders at the surface of the counterbore.

3. The method as claimed in claim 1, wherein the meanders are formed by a wire with a diameter of between 120 and 160 microns.

4. The method as claimed in claim 1, wherein the meanders are formed by a wire with a circular cross section that is embedded in the body, the cavity being formed by machining this body, a checking step being provided to measure the area of this wire exposed by the machining, the inlaying step taking place only under the proviso that this area represents at least ⅔ of the maximum area that is able to be exposed by this machining.

5. The method as claimed in claim 1, wherein the anisotropic conductive adhesive is formed of an electrically insulating matrix containing particles with a diameter of between 20 and 60 microns, this adhesive being applied with an initial thickness of between 35 and 100 microns.

6. An electronic document having
    a flat body with a constant thickness, at least 5 times smaller than its length and than its width, in which body is formed a cavity (2) of rectangular overall shape having a deep portion (2A) surrounded by a counterbore (2B) and that contains an electronic component having connection terminals (5A, 5B) that are situated on this counterbore,
    a module having a flat carrier with a thickness at most equal to the depth of the counterbore and equipped, on a face termed external face, with a plurality of external contact zones and, on a face termed internal face, with a printed circuit forming connection tracks and having connection pads (4A, 4B), in solid form, at two peripheral locations of the carrier, this printed circuit being connected to at least some of the external contact zones, the carrier furthermore being equipped, on this internal face, with a microcircuit connected to this printed circuit, this module being inlaid into the cavity, such that the connection pads (4A, 4B) of the module face the connection terminals (5A, 5B) of the component and together define an area of coverage/overlap, with interposition, between the module and the counterbore of the cavity, of an anisotropically electrically conductive adhesive formed of a plurality of conductive particles in an adhesive matrix and providing both a mechanical link between the module and the body and an electrical connection between the connection terminals of the component and the connection pads of the module,
    wherein the connection terminals (5A, 5B) of the component are formed by meanders extending parallel to the edges of the counterbore at a distance from the corners of this counterbore, and the anisotropically electrically conductive adhesive has a coefficient of overlap, by the particles, of the area of overlap, of between 5 and 8%.

7. The document as claimed in claim 6, wherein the anisotropic conductive adhesive is formed of an electrically insulating matrix containing particles with a diameter of between 20 and 60 microns, this adhesive being applied with an initial thickness of between 35 and 100 microns.

8. The document as claimed in claim 6, wherein the meanders extend over a distance at least approximately equal to the dimension of the deep central portion of the cavity that is parallel to these meanders.

9. The document as claimed in claim 6, wherein the meanders extend over a distance of at most 1.60 mm in a direction perpendicular to these meanders, and have a spacing of between two and three times the width of these meanders.

10. The document as claimed in claim 6, wherein the area of overlap represents 20 to 30% of the area of a connection pad that faces the counterbore of the cavity.

11. The document as claimed in claim 6, forming a card of rectangular shape.

12. The document as claimed in claim 6, the component of which is an antenna.

13. The electronic document as claimed in claim 6, wherein the module has dimensions of: 8.5 mm*11 mm.

14. The method as claimed in claim 2, wherein the meanders are formed by a wire with a diameter of between 120 and 160 microns.

15. The method as claimed in claim 2, wherein the meanders are formed by a wire with a circular cross section that is embedded in the body, the cavity being formed by machining this body, a checking step being provided to measure the area of this wire exposed by the machining, the inlaying step taking place only under the proviso that this area represents at least ⅔ of the maximum area that is able to be exposed by this machining.

16. The method as claimed in claim 3, wherein the meanders are formed by a wire with a circular cross section that is embedded in the body, the cavity being formed by machining this body, a checking step being provided to measure the area of this wire exposed by the machining, the inlaying step taking place only under the proviso that this area represents at least ⅔ of the maximum area that is able to be exposed by this machining.

17. The method as claimed in claim 2, wherein the anisotropic conductive adhesive is formed of an electrically insulating matrix containing particles with a diameter of between 20 and 60 microns, this adhesive being applied with an initial thickness of between 35 and 100 microns.

18. The method as claimed in claim 3, wherein the anisotropic conductive adhesive is formed of an electrically insulating matrix containing particles with a diameter of between 20 and 60 microns, this adhesive being applied with an initial thickness of between 35 and 100 microns.

19. The method as claimed in claim 4, wherein the anisotropic conductive adhesive is formed of an electrically insulating matrix containing particles with a diameter of between 20 and 60 microns, this adhesive being applied with an initial thickness of between 35 and 100 microns.

20. The document as claimed in claim 7, wherein the meanders extend over a distance at least approximately equal to the dimension of the deep central portion of the cavity that is parallel to these meanders.

* * * * *